United States Patent [19]

Tack et al.

[11] Patent Number: 5,440,684
[45] Date of Patent: Aug. 8, 1995

[54] PARALLEL TO SERIAL CONVERSION OF INFORMATION DATA

[75] Inventors: Henri M. Tack, Edegem; Reneé R. Govaert, Kapellen, both of Belgium

[73] Assignee: AGFA-Gevaert N. V., Mortsel, Belgium

[21] Appl. No.: 895,837

[22] Filed: Jun. 9, 1992

[30] Foreign Application Priority Data

Jun. 24, 1991 [EP] European Pat. Off. ............ 91201608

[51] Int. Cl.6 ............................................. G06F 15/62
[52] U.S. Cl. ................................. 395/164; 395/108; 395/115
[58] Field of Search ............... 395/101, 114; 365/219, 365/189.12; 364/225.6, 235.7, 237.9, 930, 930.5, 930.7; 346/1.1, 29, 30, 150, 153.1, 155, 160; 345/18, 147, 197, 198

[56] References Cited

U.S. PATENT DOCUMENTS

| | | | |
|---|---|---|---|
| 4,513,313 | 4/1985 | Kinoshita et al. | 358/44 |
| 4,731,673 | 3/1988 | Yamakawa | 358/300 |
| 5,111,217 | 5/1992 | Zeise | 346/107 |
| 5,200,765 | 4/1993 | Tai | 346/107 |
| 5,300,960 | 4/1994 | Pham et al. | 346/154 |

Primary Examiner—Mark R. Powell
Assistant Examiner—U. Chauhan
Attorney, Agent, or Firm—William J. Daniel

[57] ABSTRACT

A method of manipulating a train of electrical signals equal in binary terms to the density gradation levels of a plurality of image pixels of an original image over a range of density gradation levels for controlling the reproduction of the original image on a receiving sheet in a thermal printer having an array of controllable printing elements corresponding in number to the pixels in an image line and an actuating circuit for actuating the respective printing elements in individually accessible fashion. In the method, the electrical signals for a given line of the image pixels are stored in a line memory and are outputted one by one from the line memory to a non-zero detector and downcounter for identification as to zero or non-zero status and downcounting of all non-zero signals to reduce the level thereof by one level. The detector and downcounter outputs for each signal inputted thereto a control signal to the printer actuating circuit which is a printing signal for each non-zero pixel signal and a non-printing signal for each zero pixel signal to actuate the corresponding printing elements for one printing time period which is selected to result in a reproduction on the receiving sheet of one density gradation level. A feedback re-circulates the zero and value-reduced signals from the downcounter to the input of the line memory for re-delivery to the non-zero detector and downcounter. The cycle is repeated for a total number of cycles necessary for all pixel signal values to be reduced to zero. The printing elements are actuated for a number of printing time periods equal to the total number of cycles so that the ultimate density of each of the reproduced pixels equals the aggregate of the density gradation levels reproduced on the receiving sheet.

7 Claims, 8 Drawing Sheets

PRIOR ART P/S CONVERTER

PARALLEL TO SERIAL CONVERSION OF INFORMATION DATA

FIELD OF THE INVENTION

The present invention relates to a process for converting data, e.g. in the form of electrical signals corresponding for instance to the pixels of images, from a parallel configuration to a serial configuration, as applied to recording techniques. e.g. in the field of thermal dye transfer printing of reproductions of such images.

BACKGROUND OF THE INVENTION

Thermal dye transfer processes have been developed to make prints from a pattern of electronic information signals, e.g. to make print copies of pictures that have been generated electronically by means of a color video camera. To make such prints, the electronic picture can be subjected to color separation with the aid of color filters. The different color separations thus obtained can then be converted into electrical signals which can be processed to form cyan, magenta, and yellow electrical signals. The resulting electrical color signals can then be transmitted to a thermal printer. To make the print, a dye donor element having a repetitive pattern of separate blocks of yellow, magenta, and cyan (and optionally black) dyes is placed in face-to-face contact with a receiving sheet and the resulting sandwich is inserted between a thermal printing head and a platen roller or drum. The thermal printing head is provided with a plurality of juxtaposed heating elements, e.g. such as heat-generating resistors, and can apply heat to selective regions of the back of the dye donor element. For that purpose, the heat-generating elements of the printing head are heated up sequentially in correspondence with the cyan, magenta, and yellow electrical signals, so that dye from the selectively heated regions of the dye donor element is transferred to the receiving sheet and forms a pattern thereon, the shape and density of which are in accordance with the shape and density of the heat applied to the dye donor element.

To achieve the area-wise selective heating of the dye donor element, the thermal printer is designed so that the heating elements thereof can be individually activated by drive signals to effect the thermal transfer of the dye from donor element to receiving sheet.

The image-wise heating of the dye donor element is performed on a line-by-line basis, with the heating elements geometrically juxtaposed alongside one another and with gradual (serial) adjustment of the output intensity of the elements to effect corresponding variation in density of the transferred dye. In contrast, the electrical image data (also referred to as "picture data" or "pixel data") are mostly stored in a parallel organized memory, such as a first-in-first-out (FIFO/fifo) memory or a random access (RAM/ram) memory.

Therefore, a thermal dye transfer printer needs to be able to convert image data signals from a parallel input configuration to a serial output configuration (refereed to for convenience as a P/S conversion). The serial configuration of image data signals resulting from this conversion are used to activate or "drive" the heating elements of the thermal printing head, resulting in recordation of the data on the receiving sheet.

In European patent EP 0 208 919, a P/S conversion is described which uses a comparator device. In this device, the actual image (pixel) data, wherein the binary equivalent of pixel density is represented by bytes consisting of eight bits in parallel, are delivered to one input terminal of a comparator, and the output of a clocked counter which increases incrementally in sequence is fed to a second input terminal of the comparator. The comparator output remains high (expressed symbolically as "logic 1") as long as the magnitude of the counter output at the second terminal is lower than binary equivalent of the pixel density at the first terminal. As soon as the counter output reaches the level equal in binary equivalent terms of the actual pixel density, the comparator output reduces to a low level state (symbolically "logic 0").

OBJECTS OF THE INVENTION

It is an object of the present invention to provide an alternative procedure for carrying out in a thermal dye transfer printing process a P/S conversion which utilizes a simple electrical circuit which is economically quite cost efficient and technically of high reliability.

Another object of the invention is to provide a sequential output of pixel signals that can be efficiently adapted to control in a simple manner the density or gradation level of the pixels in a reproduction image.

A further object of the invention is an increased system flexibility in that the format of the image data memory can be easily expanded by cascading several memories in series, e.g. in the case of more line information, resulting from longer lines and/or higher spatial resolution, or by connecting several memories in parallel, e.g. in the case of bytes each constituted of a greater number of bits to thereby increase the number of pixel density levels that can be reproduced.

Still further objects will become apparent from the following description and the appended claims with reference to the accompanying drawings.

SUMMARY OF THE INVENTION

The above objects for effecting an electronic conversion of electrical signals representing at least one line of image data and having a value corresponding to different density gradation levels of such image ranging from zero density level to a maximum level from a parallel configuration to a serial configuration are accomplished by a process which comprises under controlled synchronization, the steps of:

a. Delivering into a memory a configuration of data signals representing one line of an image to be reproduced, b. Transferring the data signals of each image line from the memory to a downcounter and non-zero detector to discriminate between zero and non-zero signal levels and incrementally reduce the value level of an any non-zero signals by a fixed level, and C. For each detected non-zero signal, applying to a control circuit of a thermal printer a corresponding driving signal and recirculating to the memory the data signals for further non-zero detection and signal level reduction (downcounting) which is repeated until all signals have been reduced to a zero level.

The control circuit of the thermal printer includes a latching memory circuit for storing the driving signals which are delivered to the printer when the latching circuit is activated by means of a strobe signal. After the latching circuit has been activated, e.g. by the strobing, the driving signals can be used e.g. to actuate separate heating elements of a thermal dye transfer printer over a variable duration of time correlated to the pixel density so that the heating elements, e.g. resistors, become heated sequentially in correspondence with pixel density variations.

More particularly, the P/S conversion method of the invention treats the line image data from a buffered memory in the form of data for a single line of pixels. The data signals (pixel values varying in (binary) value level over a number of levels corresponding to a range of pixel densities) are "questioned" repetitively with a series of d number of iterations reducing the value level by one level, by taking for each of the pixel values of such line the following steps:

1. Detecting whether all of the pixels of a line are at a value equal to zero at the time, 2. For each non-zero (binary) pixel value so detected, repetitively downcounting such non-zero value by a value level of one until all of the pixel values for the line have reached a zero status to thereby generate a bit signal with a binary value corresponding to the actual original binary value of each pixel, and 3. Shifting to a latching memory circuit in sequence according to each pixel, the bit corresponding to actual pixel value.

At the output of e.g. a thermal dye transfer printer, each image line signal data are written in the form of stepwise increments each equal to one unit of time, generated by a clock, each such time unit being made equivalent to one step (quantum) of heat energy for effecting incremental stepwise change in the level of dye transfer in order to reproduce image density variations. The integration or summation of the units of time for each pixel determines the ultimate density of the dye image of that pixel.

The P/S conversion method of the present invention will be described with respect to a thermal printing head having one row of heating elements, forming a one-dimensional array, extending parallel to the printing drum axis, so that heating and dye transfer are performed on a line-by-line basis. However, the heating elements could be otherwise arranged, e.g. coaxially juxtaposed to neighboring elements in adjacent relation, or even to heating elements geometrically displaced under different angular relationship to the drum axis.

DESCRIPTION OF PREFERRED EMBODIMENTS

Figure 1:
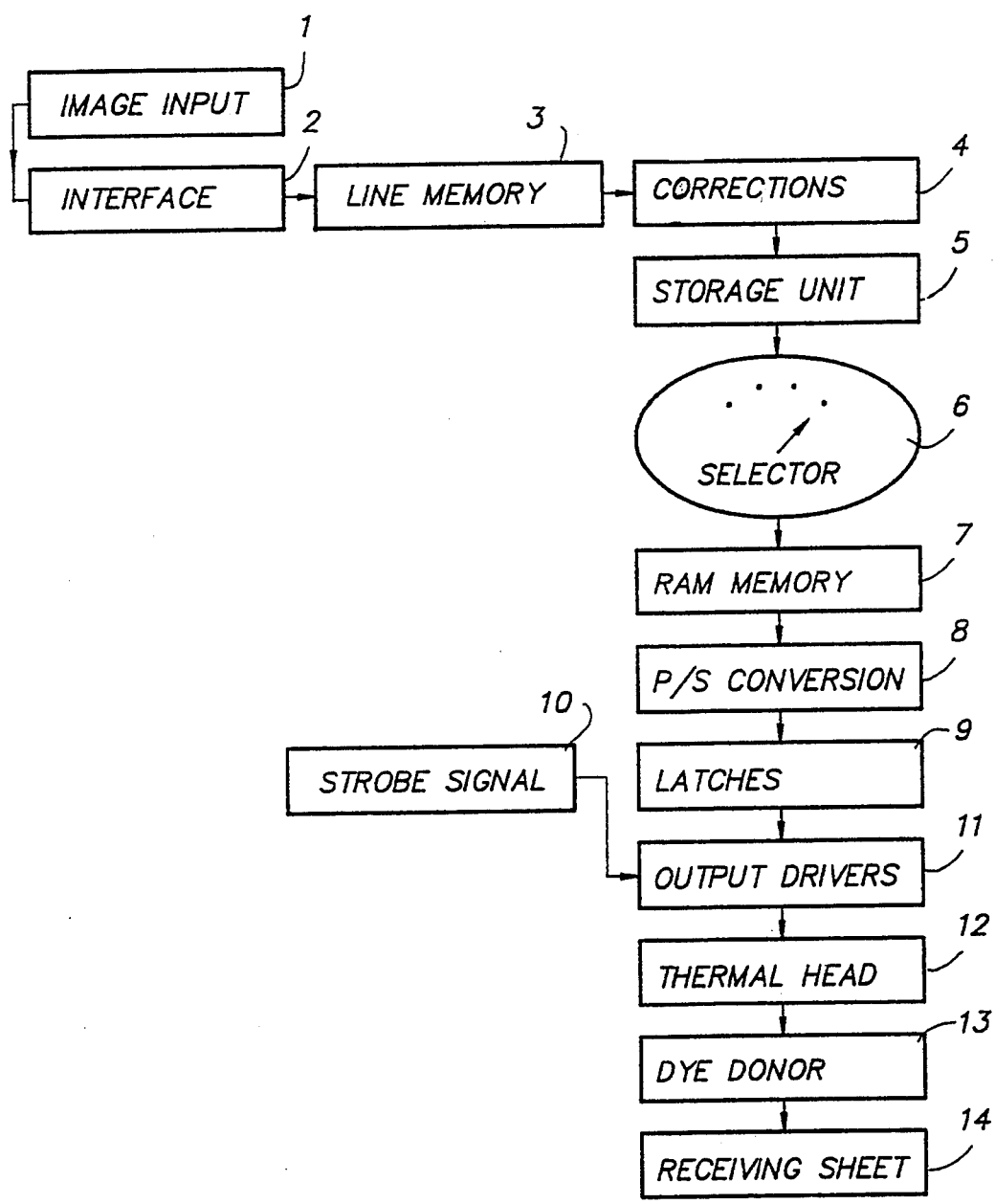
FIG. 1 is an overall block diagram, illustrating one embodiment of a thermal dye transfer process embodying a P/S conversion procedure according to the invention.

An understanding of the invention will now be clarified with reference to preferred embodiments set forth in the drawings.

A thermal dye transfer printer including a P/S conversion circuit according to the invention is schematically illustrated in FIG. 1. As shown in FIG. 1, a thermal dye transfer printing system normally includes an image input 1 with an interface 2, a line memory 3, several corrections 4, a storage unit 5, a color selection switch 6, a memory 7, a P/S conversion circuit 8, a latching memory and strobe circuit 9 and 10, output drivers for the heating elements of a thermal head, a thermal printing head 12 including the heating elements, a dye donor element 13 and a receiving sheet 14. Printing head corrections, clock synchronization signals etc. are also provided but not shown in FIG. 1.

Image data stored in the storage unit 5 are read out for each of the several separate colors by selector switch 6. The data thus read out are stored on a line-by-line basis in an image line memory 7 and are then imputed as parallel image date to the P/S conversion circuit 8 for conversion into serial image data according to the invention. The inventive conversion circuit will be subsequently explained in detail.

Figure 2:
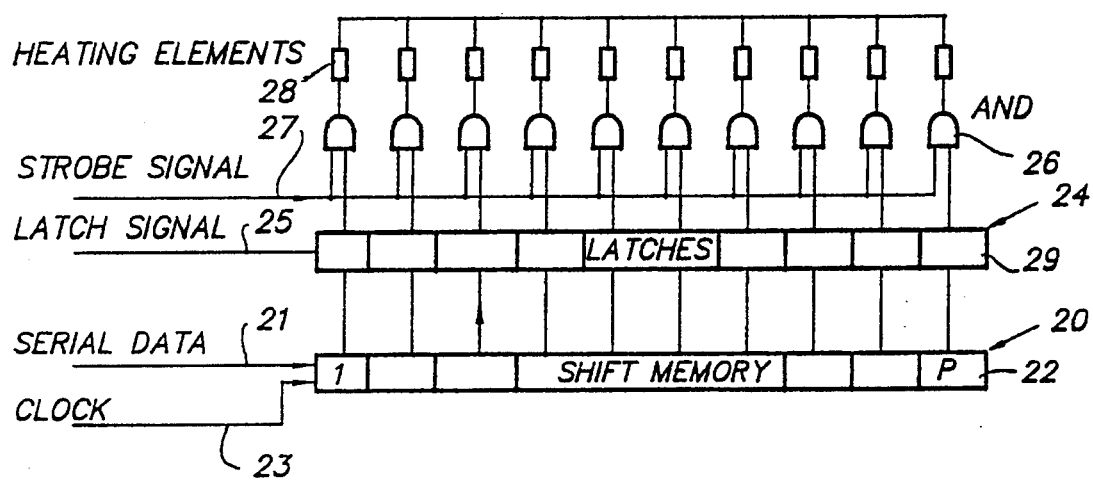
FIG. 2 is a basic diagram of the main circuit components of a thermal dye transfer printer including a latching memory and strobe in association with an array of heating elements; circuit as used in thermal dye transfer printers.

Referring to FIG. 2, the configuration of image data, designated 21, resulting from the conversion is delivered to a shift register 20, having a width equal to p number of bits, which acts as a memory, sequentially shifting one line of serially received image data under the control of a clock pulse 23 and outputting the stored one line of image data (bits) in a geometrically parallel manner as illustrated.

Still referring to FIG. 2, the thermal printing head includes the shift register 20 receiving the image data 21 from the P/S conversion circuit, a latching memory circuit 24 which receives the data outputted in parallel from the shift register and holds the data from the shift register for a period corresponding to a one-line level printing period, and an AND gate circuit 26 having an AND gate connected at one input terminal to the latching memory circuit for each bit of the latching circuit and at its output to one of the array of heating elements 28.

The image data from the shift register temporarily stored in the latching memory circuit represents the density gradations of the pixels of the original image. After all of the p number of bits corresponding to a single print line have been entered in the shift register circuit 20, a latch signal 25 is supplied to activate all of the p number of individual latches 29 so that all p bits from the shift register circuit 20 are transferred in parallel to the individual latches 29. Thereafter, the image data is held in the latching circuit and are available to appropriate logical gates, e.g. AND gates 26. By applying a strobe signal to the other input of the respective AND gates, the image data bits are delivered to the respective heating elements 28.

Figure 3:
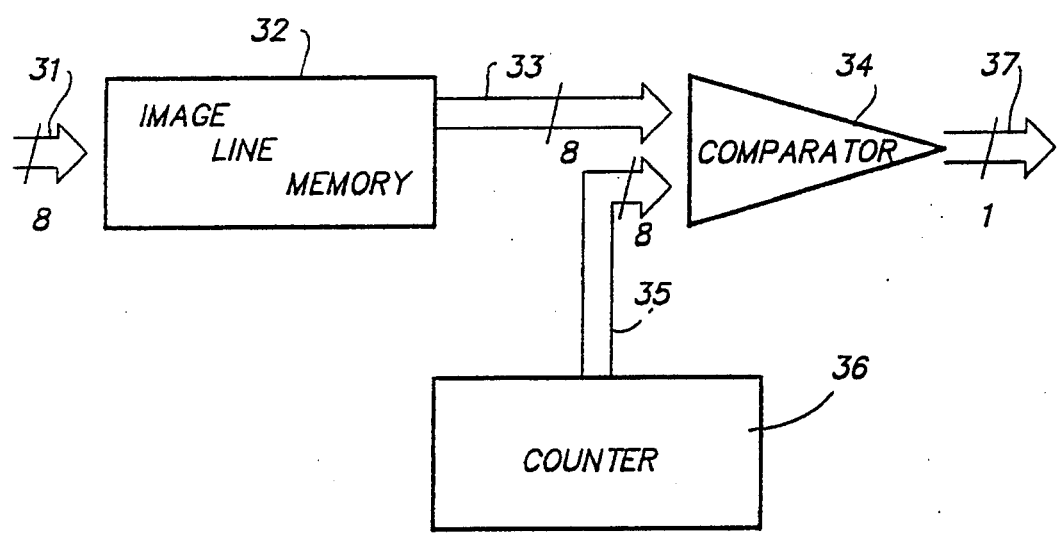
FIG. 3, is a block diagram of a prior art P/S conversion circuit as used in thermal dye transfer printers.

FIG. 3 illustrates a prior art P/S conversion using a comparator as described in European patent ER 0 0 208

919. In the conversion method of this patent, the actual image data, in the form of bytes consisting of 8 bits in parallel with one byte representing one pixel of the image and the logic equivalent of the number of bits per byte representing the density level (gradation) of the pixel, are first stored in a line memory 32 and then delivered byte by byte to one input terminal of a comparator 34. To the second input terminal of comparator 34 is fed the sequentially incremented output of a clocked counter 36. The output 37 of the comparator remains high (logic 1) as long as the counter status (magnitude of the counter output) is lower than number of bits are the other terminal which is the binary equivalent of pixel density. When the counter output reaches the number of bits are the other terminal of the comparator, representing an actual pixel density value, the comparator output switches to low level (logic 0). The image data obtained in serial configuration in this manner are fed, via a latching memory circuit, to the driving components of the thermal printing head and result in an image being recorded on a receiving sheet by dye transferred thereto.

The P/S conversion method of the present invention will now be described with reference to the accompanying drawings, especially FIGS. 4 and 9.

Figure 4:
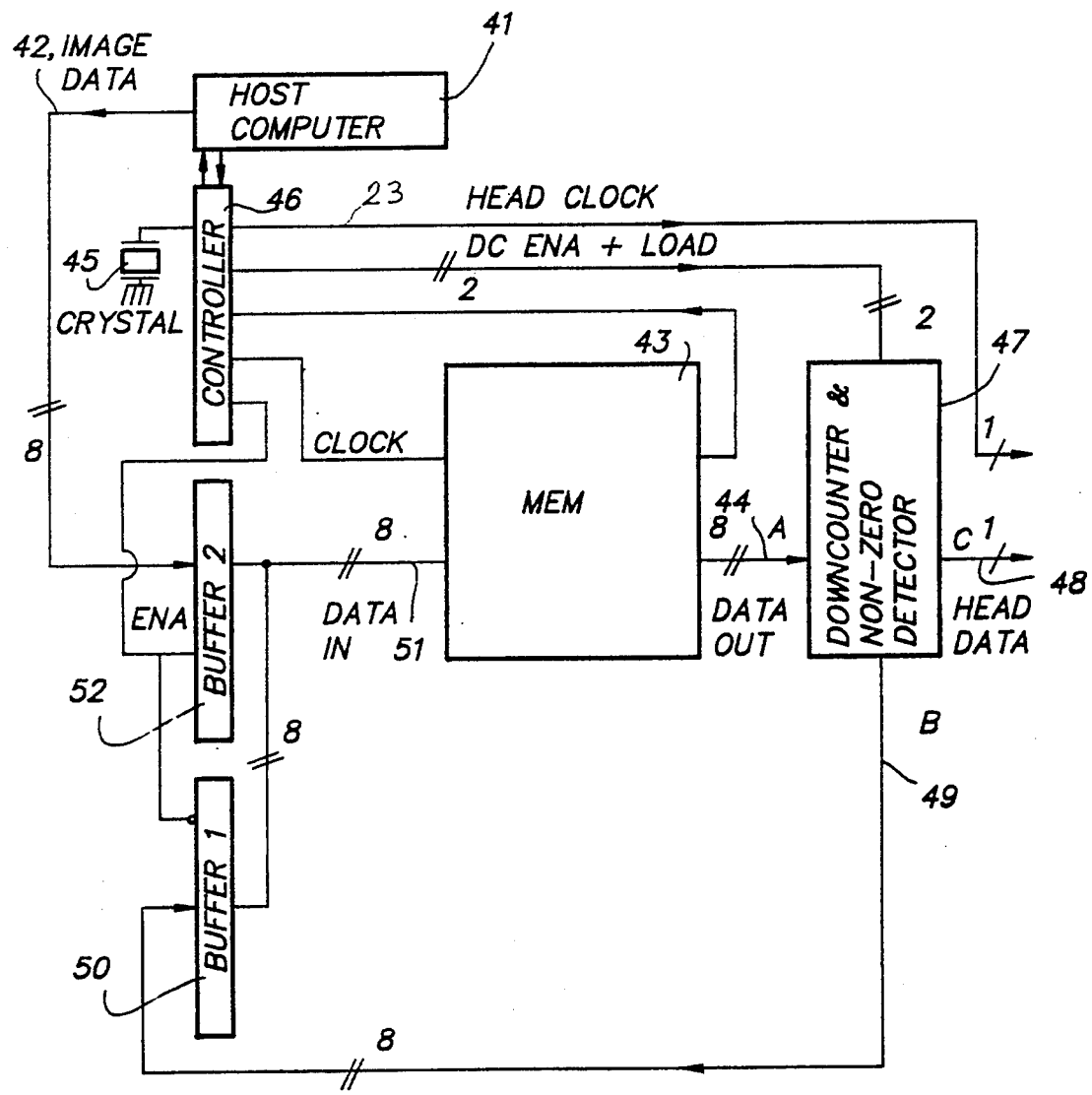
FIG. 4 is a block diagram of a P/S conversion circuit according to the present invention.

Referring to FIG. 4, a host computer 41 provides input variable image data corresponding to one image line or eventual one line part. This data are stored in parallel in a buffered line memory designated MEM 43 and are in the form of bytes, indicated symbolically as A data 44, each byte consisting, for example, of eight parallel bits A0–A7, indicated symbolically as Ai.

Using this example for illustration, every image data unit, representing an image pixel or dot, consists basically of eight bits, thus rendering it possible to represent each pixel with $2^8$th levels of different image density gradations (d) or steps or incremental units (i.e. d (density) variations = 256) for each color selection (color separation). (In the interests of simplicity, MEM 43 is assumed to be of the FIFO (i.e. a "first-in, first-out") type but the experienced designer might occasionally employ an addressed type, i.e. RAM, for MEM 43).

In brief, the controller 46 of FIG. 4 controls, in clock synchronization, the writing in and reading out of image data to and from MEM 43 in four sequential steps:

1. The image data (train of bytes) for one image line is brought into the input 51 of MEM 43 via BUFFER 2.
2. Periodically, the image data of each line is transferred from mem 43 to a downcounter and non-zero detector 47.
3. The downcounter and non-zero detector 47 and the clocking circuit for the driver components (shift register 20) of the thermal printing head are activated.
4. After downcounting (i.e. to a reduced value) and non-zero verification, output bytes 49 (at the reduced value where reduced) are ring-shifted, i.e. re-circulated, to MEM 43, via BUFFER 1.

In more detail, controller 46 is driven by a crystal 45 and at a given clockpulse, controller 46 reads out from MEM 43 all of the A data corresponding to a given first image line and transfers this A data to downcounter and non-zero detector 47.

As its name reveals, the downcounter and non-zero detector performs two functions, of which the downcounting function will be explained first, with reference to FIG. 4. (A particular embodiment of non-zero detector will be explained later with special reference to FIG. 6.)

Initially, all A-data are read out from MEM 43 and inspected (questioned) by the non-zero detector to ascertain whether the bytes thereof are zero or not. For each pixel a C-bit of data is outputted from the downcounter at a logic level corresponding to the that of the A data and delivered to the shift register 20. That is to say, for those A-data bytes ascertained by the detector to be zero, the outputted C-bit will also be zero, but for each A-data byte greater than zero, a C-bit equal to logic 1 will be outputted. At the same time, each A-data byte (greater than one) is reduced (by the downcounter) by one incremental unit (bit), resulting in a reduced data byte B. The reduced value B-data 49 are fed back (recirculated) to the input 51 of MEM 43 and shift progressively therein.

Controller 46 restarts the reading out from MEM 43 the recalculated (now reduced value) A-data bytes in turn, i.e. beginning with the byte for the first image pixel, then the next, and so on until the last byte for the final pixel p of the given image line. The A-bytes of recalculated value are transferred from MEM 43 again to the non-zero detector and downcounter 47 and the sequence is repeated for several cycles through the steps of non-zero detection, downcounting, outputting, recirculating, and so on.

The reduction in value of A-data to B-data per cycle amounts to one incremental unit (digital rank or bit), so that one has to expect a total of d number of cycles. The cycles end for a given image line as soon as the douncounter reaches the ultimate zero status (i.e. enough steps of re-circulation have occurred that all A bytes=-zero).

Figure 9:
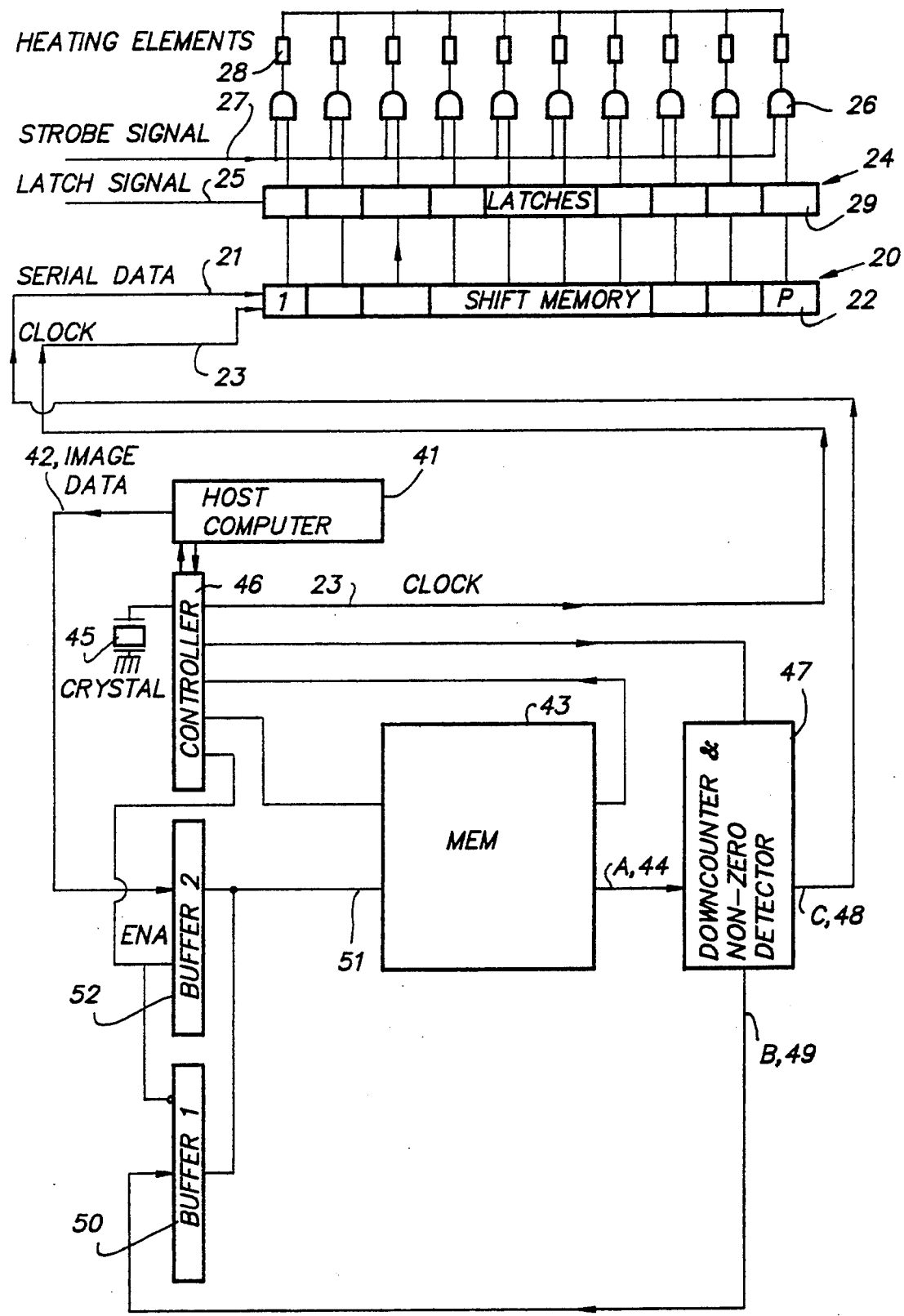
FIG. 9 is a block diagram showing a P/S conversion circuit according to the invention in association with the thermal printer circuit components.

In the interests of minimizing possible confusion, the schematic diagrams of FIGS. 2 and 4 have been combined into a composite diagram as FIG. 9 which gives a clearer picture of the interconnections between the two separate diagrams and thus an overall view of the actual inventive combination in a complete form.

Figure 5A:
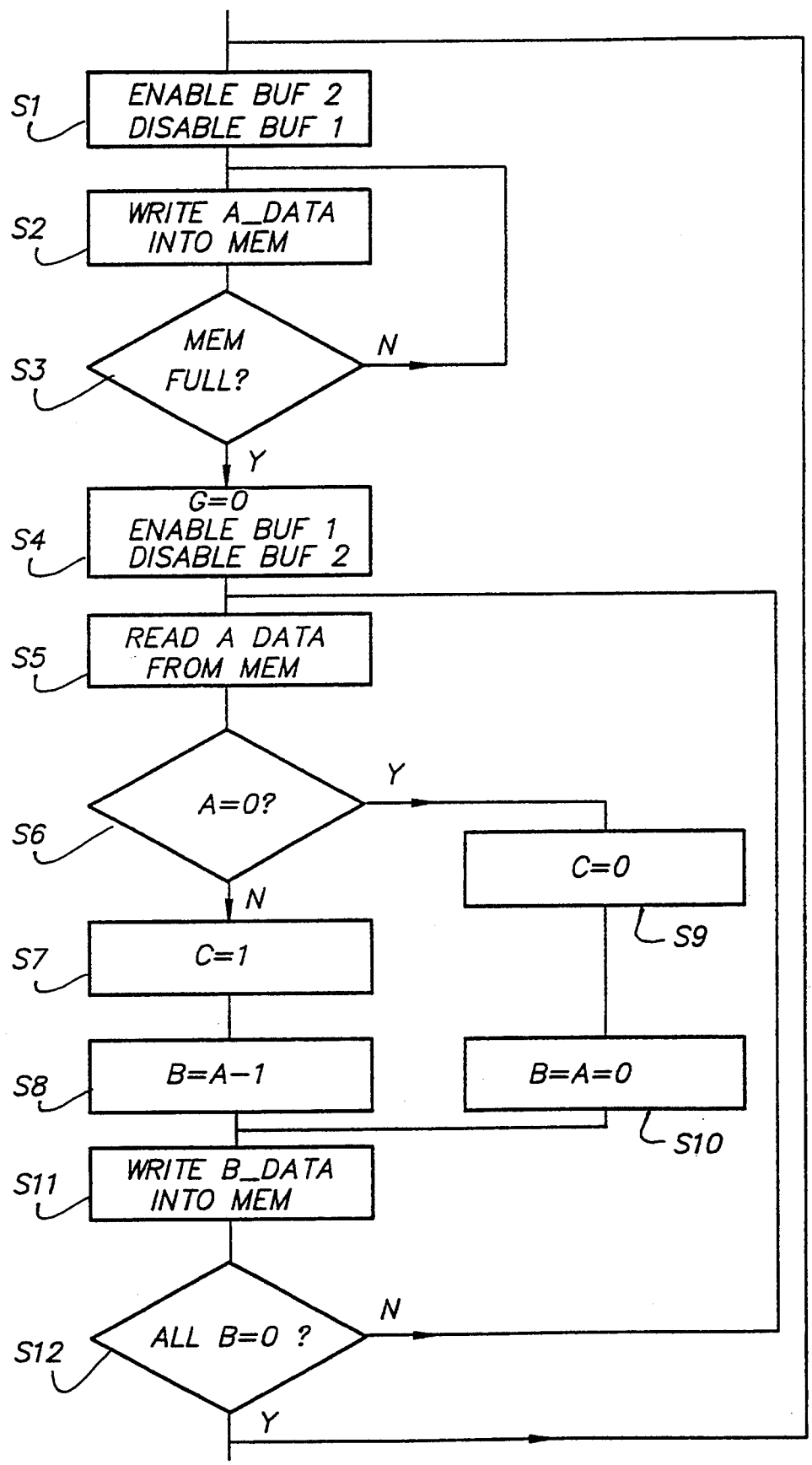
FIGS. 5a and 5b are flow charts showing the steps involved in a P/S conversion method according to the invention.
Figure 5B:
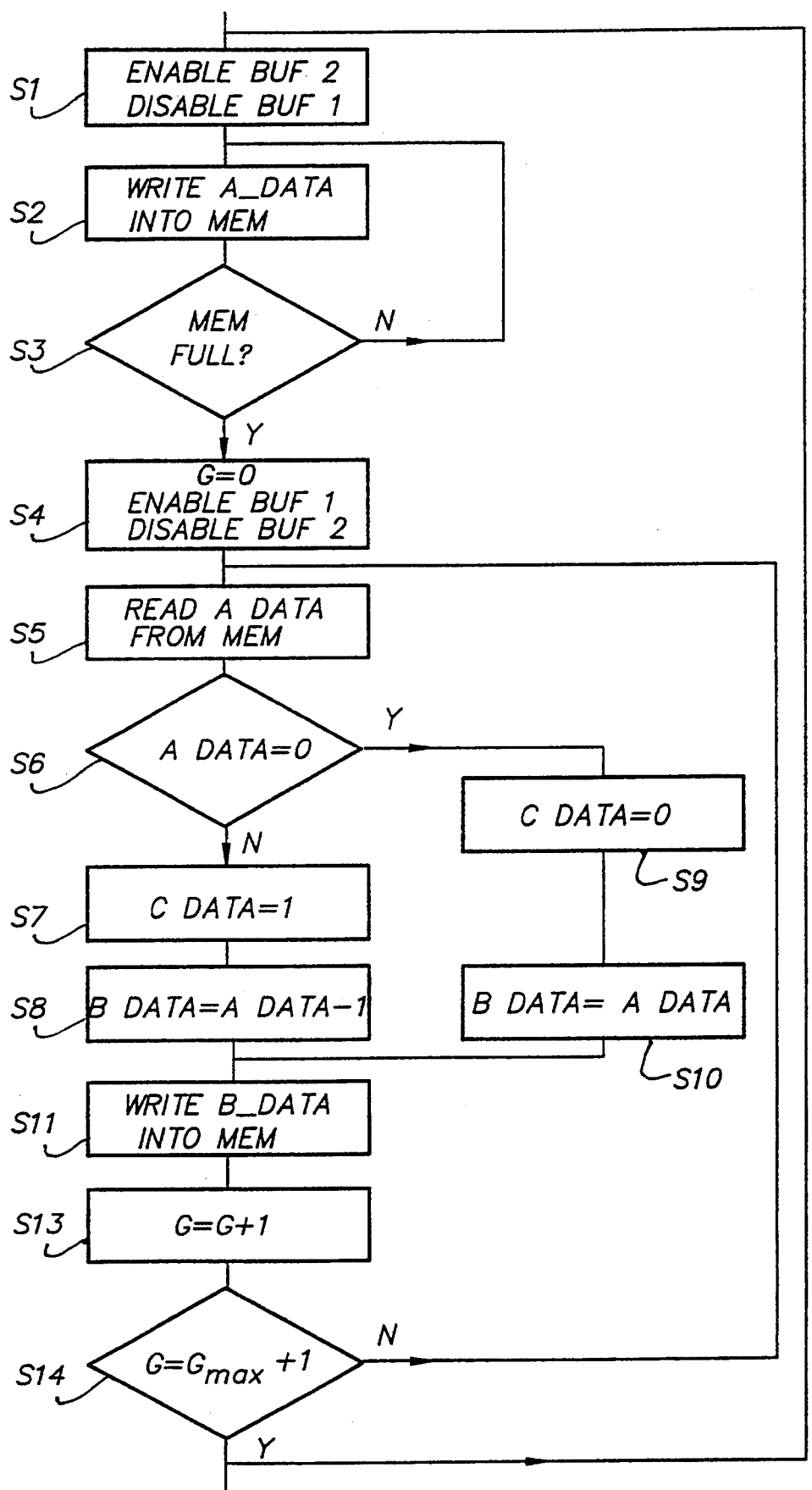

FIGS. 5a and 5b are separate flow charts illustrating the separate steps in the operation of the P/S conversion method of the present invention and will now be explained. The operational sequence can begin after the image data for one image line has been stored in the line memory in preparation for a recording operation. Initially, the correct access (input) status for MEM 43 must be chosen. This is done in a first step S 1 by disabling #1 gate buffer 50 and simultaneously enabling #2 gate buffer 52, so that in the next step S 2, all of the A-date for the given line can be written into MEM 43 via #2 gate buffer. Next, in step S 3 MEM 43 is checked to determine if it is fully loaded (i.e. whether all of the image data for the given line has been loaded successfully into the memory), (This presupposes that MEM 43 is designed with a capacity for exactly p number of pixel bytes).

At this point, the actual P/S conversion can take place. Starting with step S 4, the input to MEM 43 is disabled at #2 gate buffer 52 and enabled at #1 gate buffer 50. This prevent further external access to MEM 43 but opens the possibility of writing in recirculated data. At step S 5, all of the A-data are read out from MEM 43 to the downcounter and non-zero detector and in step S 6 such data are identified (verified) as to whether they are zero or non-zero. In step S 7, they are outputted as C-data in bitwise serial form to the driving components of the thermal printing head, while step S 8 executes a one-unit downcount (reduction in binary value) from A-data to B-data (i.e. wherein B 32 A−1).

If by the identification in step S 6, all of the A-data are found to be zero, the sequence proceeds to step S 9 wherein all of data are outputted to the thermal printing driving components as C+0 and re-circulated as B=0 to MEM 43. In either the case of B=0 or B (recalculated)=(A−1)=non-zero, step S 11 writes the B-data into MEM 43 via the #1 gate buffer 50. As soon as all B-data bytes are (eventually) found to be zero, thereby implying that all C-bits are also now zero, image data for the next image line are accepted from the host computer into MEM 43, by repeating the same sequence of operational steps.

FIG. 5b shows another embodiment of operational sequence, differing in that the one step S 12 is replaced by two steps S 13 and S 14.

In the case where for each pixel, the reduced B byte data read out of the downcounter is not zero, signifying that at least one bit of a B byte is at logic one, a signal C equal to a logic one bit is outputted from the downcounter to the shift register and thence to the latching memory circuit when the latter is activated. Enablement (strobing) of the latching memory circuit results in the application of a signal to the corresponding heating element of the thermal printing head for exactly one time unit which in turn results in the transfer to the receiving sheet of "one unit" of dye, equal to one density gradation level (one density step) of the image pixels. (The transfer of additional "units" of dye for the same pixel will be explained in connection with FIG. 7.)

For the particular case where each image byte has eight bits, as mentioned above, there is a possibility, as already noted, of 256 density gradation steps or levels. Thus, the existence of eight bit data per byte allows a total of 256 time units per heating element. As a general rule, for d number of density levels or steps to be differentiated, resulting from Antilog2(d) bits, the reading-/recalculating/non zero detecting cycle would be repeated exactly d number of times.

After completion of heat generation by the heating elements up to the last of the density gradation levels d, the printing of the initial line is terminated and the image data for the next line is applied to the line memory in preparation for printing of the next line.

Figure 6:
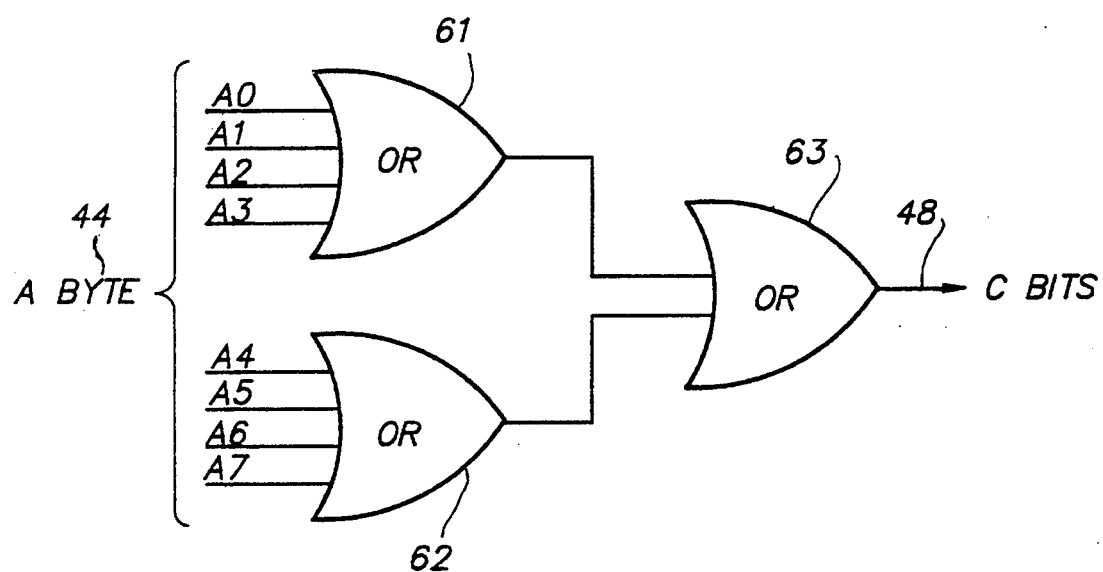
FIG. 6 is a preferred embodiment of a non-zero detector used in the P/S conversion method of the invention.

There will now be described in conjunction with the A-data in step S 6 (but which also applies to the B-data in step 12) the operation of a non-zero detection circuit, constituted of simple OR-gates 61, 62, and 63, as seen in FIG. 6. Here, if the gate for a given pixel is read as zero, signifying that all of the bits Ai of the corresponding byte of image data are at logic zero, then a C-bit 48 equal to logic zero is outputted to the corresponding driving components of the thermal printing head which precludes any transfer of dye by the corresponding heating element.

With continued reference to FIG. 6, which shows a non-zero detector for bytes each having eight bits and which uses OR-gates, the logic for controlling the thermal printing head can be formulated as C=A0+A1+A2+... A7. It will be clear to one skilled in the art that a downcounter could be built of discrete components as well as with gate array logics (e.g. gal, pal). Alternatively, the downcounter could be based on commercial components with integrated zero-detector. Further, if appropriate controls were provided, a different format for the data bytes (8, 10 or 12 bits per byte) would be handled.

Figure 7:
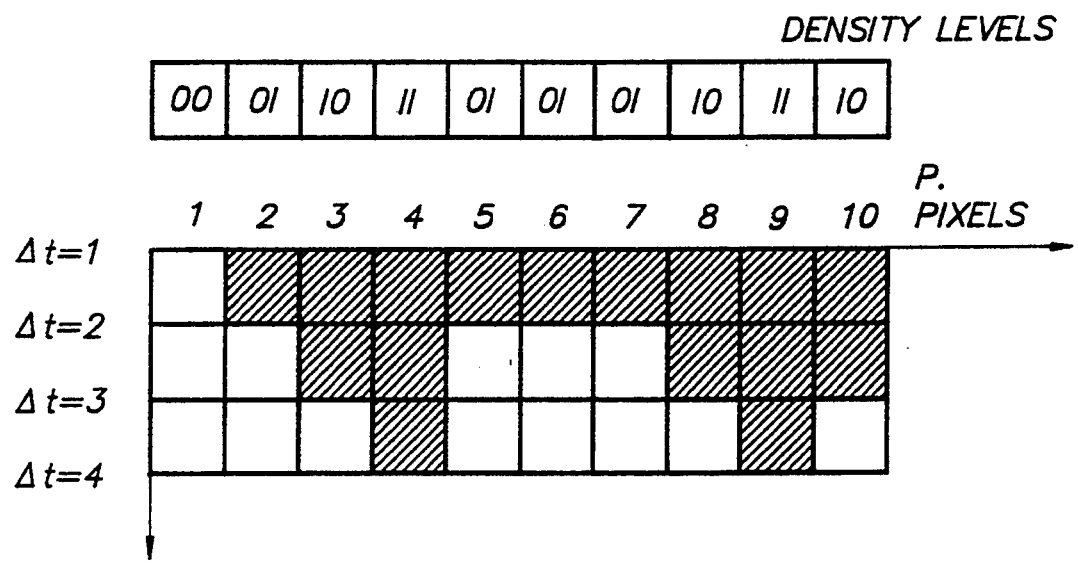
FIG. 7 is a graph illustrating with a line of 10 pixels how pixel density variation in the reproduction image is achieved by time stepwise dye transfer.

The thermal printing head normally includes a plurality of heating elements equal in number to the number of pixels in the image data present in the line memory. Remembering that each of these heating elements is capable of being energized individually by heating pulses and that the number of heating pulses for each element is controlled in accordance with the density gradation level of the corresponding pixel, FIG. 7 illustrates the heating pulse pattern for a ten element head for the simplified case where the number of pixels p equals ten and each pixel is represented by a signal byte having two bits (corresponding to a range of four density gradation levels or steps). Thus, in this case, zero density is represent by a bit logic of zero/zero, the first density step by a bit logic of zero/one, the second density step by a bit logic of one/zero, and the final density step by a bit logic of one/one.

With reference to FIG. 7 (where the pixels (p=10) are indicated numerically as well as by their logic levels, i.e. bit 1=0, 1; bit 2=0, 1)), it follows from the foregoing explanation that the application of the (recordation) pulses to the heating elements of the printing head—after the latching memory circuit has been enabled—causes current to flow through the corresponding individual elements, resulting in a pattern wherein the number of heating steps is represented by $\Delta t$ and the effect for each pixel heated during a given step are represented by the "hatched squares" and for each pixel not heated during a step by the "white squares" in FIG. 7.

The overall pulse duration (width)—resulting from the integration of the number of individual pulses for a given element —will determine the total heating (recording) energy for a given heating element in a given image line.

As the density for a given image pixel increases, the heating time of the corresponding heating element will increase proportionally, thereby increasing the heat energy outputted by that element and thus increasing the optical density of the dye transferred to the receiving sheet for that pixel. Contrariwise, where an image pixel data has a lower density level, the heating time is shortened and the corresponding "picture data" on the receiving sheet is lighter in density.

Figure 8:
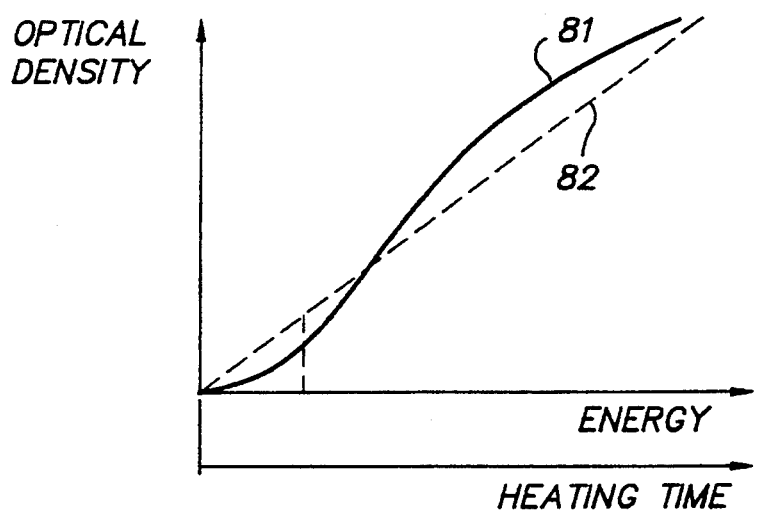
FIG. 8 is a plot showing the relationship of the expected optical print density with increasing heating time.

This relationship is shown graphically in FIG. 8 wherein a natural/normal density curve for a typical image is represented by the solid line 81 and a linear approximation of that curve is represented by a broken line 82.

Although the exemplary P/S conversion circuit shown in FIG. 4 included only a single memory MEM and a single downcounter and non-zero detector, the capacity of the circuit for more density levels could easily be extended (by connecting more MEM's in parallel) or for more information per line (by cascading more MEM's in series).

Depending on the exact configuration of the host computer and of the internal memory MEM, the image date could be stored entirely in the host computer and transferred line-by-line in sequence to the MEM, as was taken to be the case in the example described above, or they could be shifted to an addressed MEM with a capacity large enough for all the line data of a given color of a given image.

In any event, for each case, the actual electronic circuit has to be completed by some additional components not shown but such components would be obvious to those knowledgeable in the art and their omission does not degrade an understanding of the inventive concept conveyed by the exemplary circuits.

The present invention can be applied to any type of thermal recording, including the type in which image data are thermally recorded directly on a thermal recording paper, and the type in which data are thermally transferred onto ordinary paper.

The printing is not limited to the above-explained method employing a thermal printing head, but can also be carried out by other technologies such a resistive ribbon printing, dye diffusion resistor ribbon, ink-jet printing and the like.

Finally, the recording medium is not limited to a recording paper, but might be a textile fabric or a plastic web or a transparency for overhead projection.

What is claimed is:

1. A method of effecting an electronic conversion of a train of parallel configured data signals corresponding to pixels making up at least one line of an original image to be reproduced and varying in value over a range of levels, each differing from an adjacent level by one unit, from zero to a maximum and corresponding to density gradation variations in said pixels of said original image, into a serial configuration of signals having a single level above zero for controlling the reproduction of the original image, comprising, under controlled synchronization, the steps of:

a. Delivering said train of parallel configured data signals into a line memory having a capacity equal to said pixels of said at least one line,
   b. Transferring said parallel configured data signals of said train from said line memory one by one to a non-zero detector and downcounter for discrimination between a zero and a non-zero level and a reduction of all non-zero levels thus discriminated by a level of one unit while the zero level signals remain at zero,
   c. Outputting from said detector and downcounter to a control memory a train of control signals of zero value for all data signals discriminated as zero and unity value for all data signals discriminated as non-zero while feeding back to the line memory the train of data signals with all non-zero level signals at the reduced level, and
   d. Repeating step c. until all non-zero level signals have been reduced to zero.

2. A method according to claim 1 wherein said line memory is a first-in-first-out memory or a randomly addressable memory.

3. A method according to claim 1 wherein said control memory comprises a shift register and an associated latching memory circuit which are adapted to be actuated to receive and store the control signals in sequence and deliver the control signals on signal.

4. A method according to claim 3 wherein said original is to be reproduced by means of a thermal printer which includes a number of printing elements operable to generate a reproduction and said control signals are applied by said latching memory circuit on said signal to said printing elements to operate the same.

5. In a method of manipulating a train of electrical signals equal in value to the density gradation levels of a plurality of image pixels of an original image over a range of density gradation levels from zero to a maximum for controlling the reproduction of the original image on a receiving medium in a thermal printer having an array of controllable printing elements corresponding in number to the pixels in an image line and an actuating circuit for actuating the respective printing elements in individually accessible fashion, the method which comprises, under controlled synchronization, the steps of:

a) Storing said train of electrical signals for a given line of image pixels in a line memory via an input thereto,
   b) Transferring said signals one by one from the line memory to a detector and downcounter for discriminating between a zero value signal and any non-zero value signal and for downcounting of all non-zero value signals to reduce the level thereof by one level,
   c) Outputting from said detector and downcounter for each signal inputted thereto a control signal to the printer actuating circuit, said control signal being a printing signal for each non-zero value signal and a non-printing signal for each zero value signal, said control signal having a duration of one time unit which is selected to equal a reproduction by said thermal printer on said receiving medium of an image having one density gradation level,
   d) Actuating the printing elements of said thermal printer by the actuating circuit thereof in correspondence with said control signals said one time period,
   e) Returning to the input of said lime memory the zero value and value-reduced non-zero signals from the detector and downcounter for transfer again to said non-zero detector and downcounter, and
   f) Repeating steps b)–e) for a total number of cycles necessary for all non-zero signal values to be reduced to zero, whereby the printing elements of said printer are actuated for a number of time periods equal to the total number of cycles to reproduce on said receiving sheet images of said pixels of said original image varying in density in correspondence with the density variations of the pixels of said original image.

6. The method of claim 5 wherein said train of electrical signals represent a single line of a pixels of a single color derived from a multi-color original.

7. The method of claim 6 wherein said multi-color original contains magenta, cyan, and yellow, and optionally black, colors, and the pixels represented by said signals are of one of said colors.

* * * * *